United States Patent
Wu et al.

(10) Patent No.: US 7,755,904 B2
(45) Date of Patent: *Jul. 13, 2010

(54) SLIDING FLAT PANEL DISPLAY AND KEYBOARD MODULE

(75) Inventors: Sui-An Wu, Taipei Hsien (TW); You-Lin Shih, Taipei Hsien (TW)

(73) Assignee: Aten International Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/113,809

(22) Filed: May 1, 2008

(65) Prior Publication Data

US 2008/0204982 A1 Aug. 28, 2008

Related U.S. Application Data

(63) Continuation of application No. 11/203,246, filed on Aug. 15, 2005, now Pat. No. 7,405,926.

(30) Foreign Application Priority Data

Apr. 18, 2005 (TW) ............... 94112279 A

(51) Int. Cl.
H05K 7/16 (2006.01)
H05K 5/00 (2006.01)
A47B 81/00 (2006.01)
A47B 95/00 (2006.01)
A47B 88/00 (2006.01)
A47F 7/00 (2006.01)

(52) U.S. Cl. ............ 361/727; 361/724; 361/725; 361/726; 312/223.1; 312/223.2; 312/333; 312/334.4; 211/26

(58) Field of Classification Search ............... 361/681, 361/683, 724–727, 686, 679.01–679.45, 361/679.55–679.59; 312/223.1, 223.2, 333, 312/334.4; 211/26
See application file for complete search history.

(56) References Cited

U.S. PATENT DOCUMENTS

| 6,175,502 | B1 | 1/2001 | Schaerer et al. |
| 6,201,690 | B1 * | 3/2001 | Moore et al. ............ 361/683 |
| 6,563,700 | B1 | 5/2003 | Waller et al. |
| 6,609,034 | B1 * | 8/2003 | Behrens et al. ........... 700/19 |
| 6,827,409 | B2 * | 12/2004 | Michael ................ 312/223.3 |
| 6,956,735 | B2 * | 10/2005 | Lee et al. ................ 361/683 |
| 7,187,554 | B2 * | 3/2007 | Seki et al. .............. 361/727 |
| 2002/0101721 | A1 | 8/2002 | Blood |
| 2003/0197451 | A1 | 10/2003 | Michael |
| 2005/0168926 | A1 | 8/2005 | Lee et al. |

FOREIGN PATENT DOCUMENTS

| CN | 2428809 Y | 5/2001 |
| DE | 198 07 234 A1 | 11/1999 |
| JP | 2004-355205 | 12/2004 |

* cited by examiner

Primary Examiner—Jayprakash N Gandhi
Assistant Examiner—Nidhi Desai
(74) Attorney, Agent, or Firm—Chen Yoshimura LLP

(57) ABSTRACT

A sliding flat panel display and keyboard module for monitoring and controlling server computers on a server rack is described. The sliding flat panel display and keyboard module has an L-shaped supporting frame, a vertical sliding rail, a horizontal sliding rail, a flat panel display, and a keyboard. The vertical sliding rail and the horizontal sliding rail are respectively disposed on a vertical surface and a horizontal surface of the L-shaped supporting frame. The flat panel display couples to the vertical sliding rail and the keyboard couples to the horizontal sliding rail, so that the flat panel display and the keyboard are able to slide on the L-shaped supporting frame horizontally.

20 Claims, 4 Drawing Sheets

SLIDING FLAT PANEL DISPLAY AND KEYBOARD MODULE

This application is a Continuation of application Ser. No. 11/203,246 filed Aug. 15, 2005 now U.S. Pat. No. 7,405,926, and for which priority is claimed under 35 U.S.C. §120; and this application claims priority of application Ser. No. 94,112,279 filed in Taiwan, R.O.C. on Apr. 18, 2005 under U.S.C. §119; the entire contents of all are hereby incorporated by reference.

BACKGROUND OF THE INVENTION

1. Field of the Invention

The present invention generally relates to a sliding flat panel display and keyboard module. More particularly, this invention relates to a sliding flat panel display and keyboard module for a server rack-mounted KVM switch.

2. Description of the Related Art

Information technology and the computer industry are highly developed now. People rely heavily on computer systems. Therefore, computer servers with high calculation capacity and high stability are important for computer systems. Due to increasingly reduced office space, area occupied by computer servers must also be reduced. Computer servers must maintain a high degree of stability to serve users, and the space occupied by one computer server is therefore greater than or equal to that of a desktop computer. Accordingly, the management of computer servers is difficult and space utilization is tightened. Some companies have two or three computer servers, while others may have more than a thousand computer servers. Computer server management and space utilization become more critical in companies with more computer servers.

A 1U computer server assembled on a standard 1U server rack is the mainstream computer server arrangement. Each standard layer of the server rack is about 1.75 inches (about 4.5 centimeters), so that the 1U server and the server rack effectively conserve occupational space of the computer servers. Moreover, the 1U servers and racks are more efficiently controlled because the 1U servers and racks can be centrally managed and easily stacked. Normally, hardware used in the 1U server is provided with a smaller size and lower height to fit the thickness limitation of 1.75 inches.

For conveniently controlling the stacked 1U computer servers on the server rack, users utilize KVM switches to connect and control the computer servers. Hence, the quantity of the display and keyboard for controlling the computer servers can be effectively reduced and the occupied space thereof is also reduced.

However, due to the height constraints on the 1U server rack, the dimensions of the keyboard and the display have to fulfill the dimension limitations to operate on the server rack. Additionally, even under the dimension limitations, the keyboard and the display have to further improve the strength and the safety thereof to provide a safe and reliable working environment for users.

SUMMARY OF THE INVENTION

It is an objective of the present invention to provide a sliding flat panel display and keyboard module with separated sliding rails for operating on the server rack conveniently.

It is another objective of the present invention to provide a sliding flat panel display and keyboard module using rails perpendicular to each other for supporting the flat panel display and the keyboard, respectively, to firmly couple the flat panel display and the keyboard on the server rack.

It is yet another objective of the present invention to provide a sliding flat panel display and keyboard module with a positioning device to maintain safety when operating the flat panel display and keyboard and further maintain stability for storing the flat panel display and keyboard. The operating reliability and preservation of the stability of the sliding flat panel display and keyboard module on the server rack can thus be guaranteed.

To accomplish the above objectives, the present invention provides a sliding flat panel display and keyboard module. The sliding flat panel display and keyboard module includes an L-shaped supporting frame, a vertical sliding rail, a horizontal sliding rail, a flat panel display, and a keyboard. The vertical sliding rail is configured on a vertical plane of the L-shaped supporting frame and the horizontal sliding rail is configured on a horizontal plane of the L-shaped supporting frame. The flat panel display is coupled to the vertical sliding rail for moving along the L-shaped supporting frame horizontally and the keyboard is coupled to the horizontal sliding rail for moving along the L-shaped supporting frame horizontally.

The L-shaped supporting frame is utilized to couple with a server rack, e.g. a 1U server rack, for configuring the sliding flat panel display and keyboard module on the server rack. The horizontal sliding rail further includes a positioning mechanism disposed at a rear portion of the keyboard to lock the keyboard in a predetermined position when the keyboard is drawn out. The positioning mechanism preferably includes a spring piece and a positioning slot, and the spring piece couples to the positioning slot when the keyboard reaches the predetermined position.

The keyboard further has a linking plate to link the keyboard together with the flat panel display while drawing out the keyboard so as to easily open the keyboard with the flat panel display. The flat panel display further has a first positioning switch controlling a positioning pin. The positioning pin inserts into a positioning hole on the vertical sliding rail when the flat panel display is retrieved so that the flat panel display can be stored on the server rack and avoid unexpectedly opening under an unexpected vibration or force.

The sliding flat panel display and keyboard module further has a second positioning switch and a positioning hole. The positioning hole is disposed at a front portion of the vertical sliding rail. The second positioning switch on the flat panel display couples to the positioning hole when the flat panel display is drawn out. An open angle between the flat panel display and the keyboard is larger than 90 degrees, and preferably about 95-97 degrees, when the flat panel display is drawn out and opened upwardly.

A width of the horizontal sliding rail of the sliding flat panel display and keyboard module can be wider than a thickness of the keyboard, and a height of the vertical sliding rail can be larger than a thickness of the flat panel display so as to increase the supporting force for the flat panel display and the keyboard.

Another aspect of the present invention is to provide a server rack-mounted KVM switch for assembly on a server rack. The server rack-mounted KVM switch utilizes the sliding flat panel display and keyboard module to couple with a KVM switch module and a control module to enable the server rack-mounted KVM switch to be operated in a safe and reliable environment.

Hence, the sliding flat panel display and keyboard module and the KVM switch with the sliding flat panel display and keyboard module can provide a safe and reliable operation on a server rack so as to allow the user to work comfortably and safely.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE INVENTION

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1A:
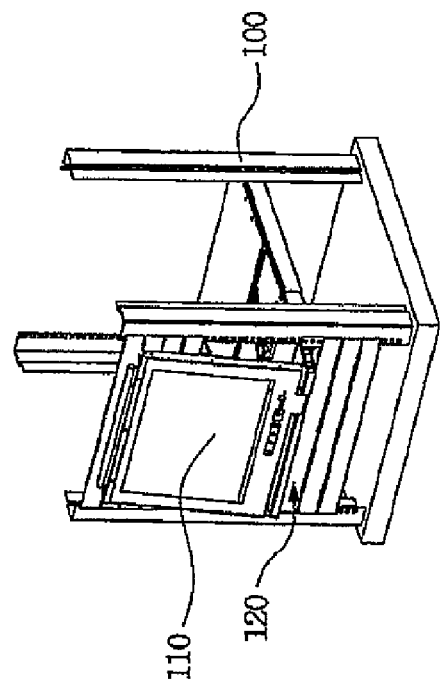
FIGS. 1A to 1D illustrate a preferred embodiment of the sliding flat panel display and keyboard module according to the present invention.
Figure 1B:
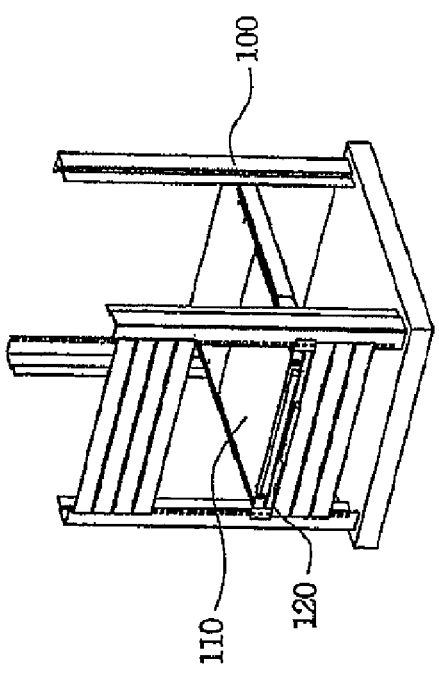
Figure 1C:
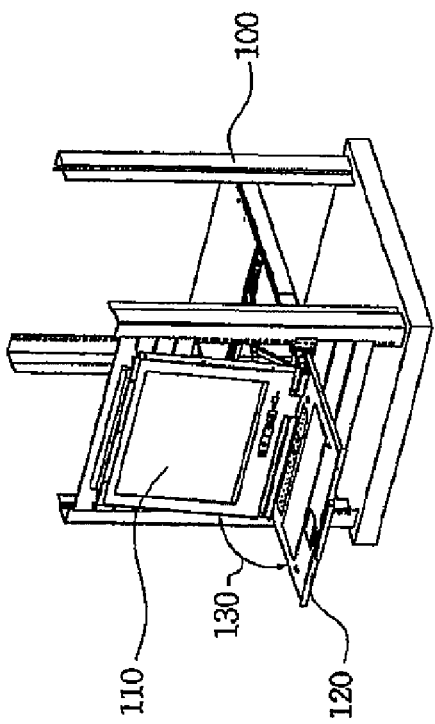
Figure 1D:
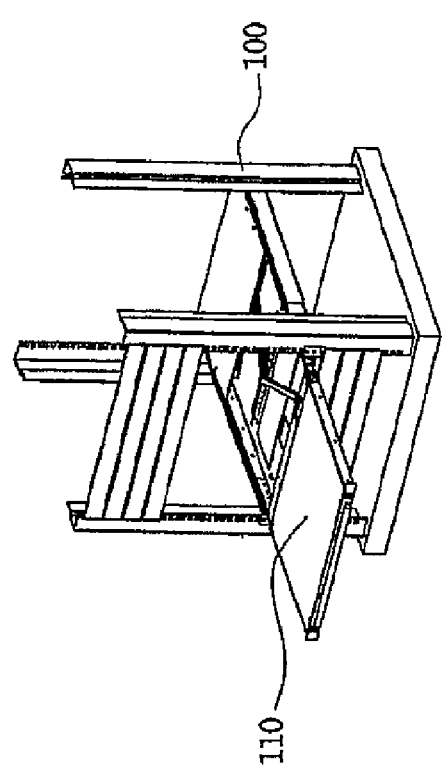

FIGS. 1A to 1D illustrate a preferred embodiment of the sliding flat panel display and keyboard module according to the present invention. The sliding flat panel display and keyboard module is preferably configured on a server rack 100, such as, for example, a 1U server rack. The sliding flat panel display and keyboard module according to the present invention includes a flat panel display 110 and a keyboard 120, and both are able to slide on the server rack 100. FIG. 1A illustrates the sliding flat panel display and keyboard module retracted in the server rack 100. FIG. 1B illustrates the flat panel display 110 just drawn out from the server rack 100. FIG. 1C illustrates the flat panel display 110 drawn out alone and opened upwardly, and FIG. 1D illustrates the flat panel display 110 and keyboard 120 drawn out simultaneously. An open angle 130 of the flat panel display 110 of the sliding flat panel display and keyboard module according to the present invention is preferably greater than 90 degrees, and is more preferably about 95-97 degrees. This allows users to monitor conveniently the flat panel display 110. Furthermore, the flat panel display 110 can also avoid reducing the open angle 130 to less than 90 degrees. A small open angle may influence how the users operate the computer, sometimes caused by the flat panel display 110 interfering with a device handle disposed above the flat panel display 110.

Figure 2:
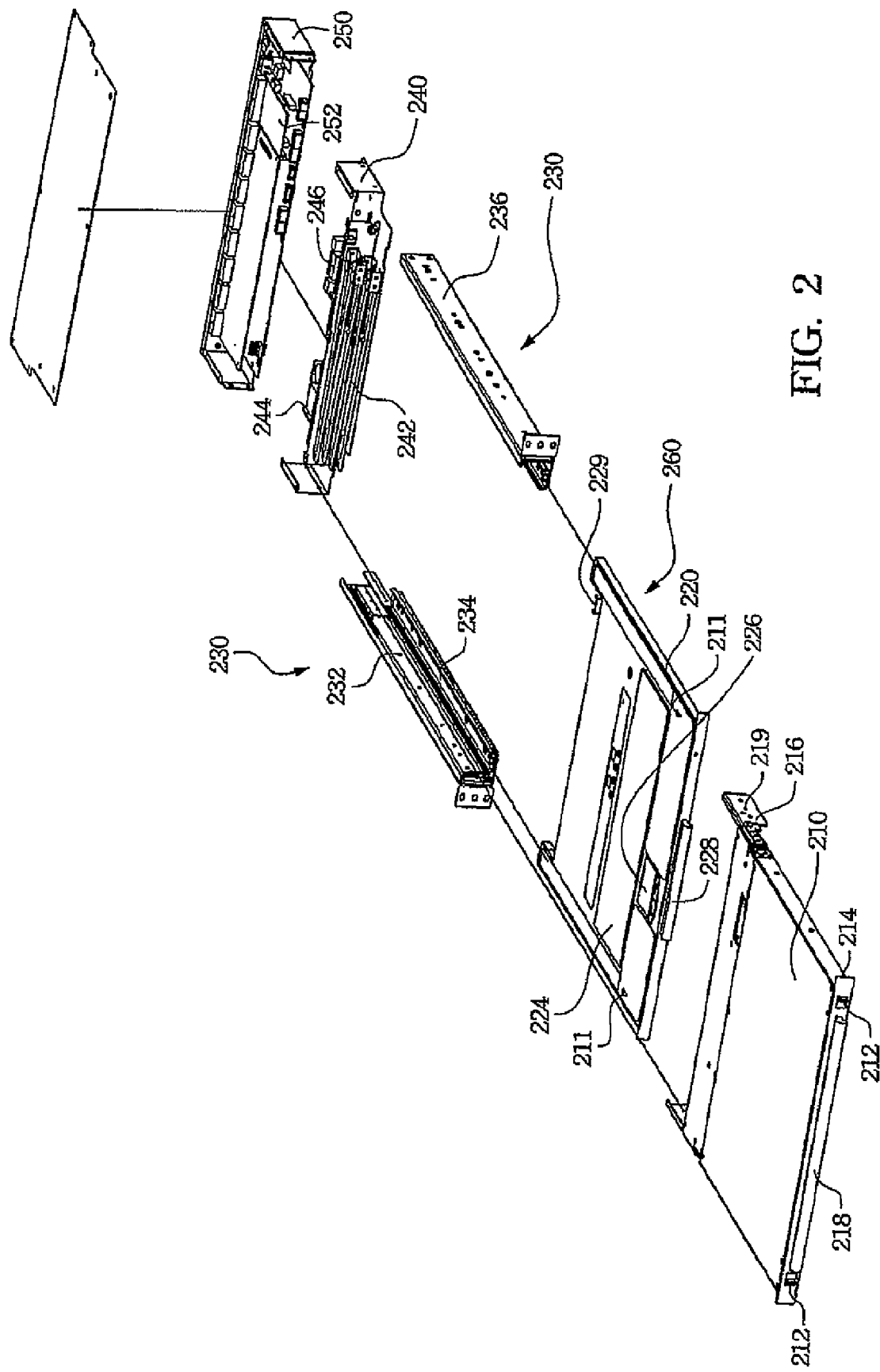
FIG. 2 is an exploded view of the preferred embodiment of FIGS. 1A to 1D.

FIG. 2 is an exploded view of the preferred embodiment of FIGS. 1A to 1D to illustrate the detailed components of the sliding flat panel display and keyboard module according to the present invention. Referring to FIG. 2, the sliding flat panel display and keyboard module include a flat panel display 210, a keyboard 220, and a sliding module 230. The sliding module 230 is composed of an L-shaped supporting frame 236, a first rail 232, and a second rail 234. The first rail 232 is preferably a vertical sliding rail, and the second rail 234 is preferably a horizontal sliding rail 234 perpendicular to the first rail 232. The L-shaped supporting frame 236 is a rigid supporting frame to couple with the server rack and support the vertical sliding rail 232 and the horizontal sliding rail 234 thereon. The vertical sliding rail 232 is fixed on a vertical plane of the L-shaped supporting frame 236 and the horizontal sliding rail 234 is fixed on a horizontal plane of the L-shaped supporting frame 236.

The flat panel display 210 couples to the vertical sliding rail 232 of the sliding module 230 to allow the flat panel display 210 to slide horizontally along the sliding module 230. The flat panel display 210 is thus allowed to be retracted or drawn out on the sliding module 230. The keyboard 220 couples to the horizontal sliding rail 234 of the sliding module 230 to allow the keyboard 220 to slide horizontally along the sliding module 230, thus enabling the keyboard 220 to be retracted or drawn out on the sliding module 230.

The flat panel display 210 and the keyboard 220 independently couple to respective vertical sliding rail 232 and horizontal sliding rail 234 so that the user may draw out the flat panel display 210 alone to monitor the server computers or simultaneously draw out the keyboard 220 to control the server computers on demand. That is to say, the keyboard 220 can be drawn out from the sliding module 230, from the server rack, to control the server computers with keys 224 and touch pad 226 on the keyboard 220 according to need.

The flat panel display 210 can be drawn out from the server rack alone and then opened upwardly (referring to FIG. 1C) to monitor the server computers. At this moment, the keyboard 220 need not be drawn out from the server rack. Therefore, the users' working path in a computer center can be wider without the drawn out keyboard 220 blocking the path. The keyboard 220 has to be drawn out from the server rack only when the user has to operate the server computers, thereby smoothing the working path in the computer center, and allowing users greater convenience when moving around to check the server computers.

Furthermore, the horizontal sliding rail 234 can effectively increase the operating stability of the keyboard 220. The keyboard 220 adopts the horizontal sliding rail 234 to slide horizontally on the server rack so that a width of the horizontal sliding rail 234 is not a thickness limitation of the keyboard 220. Hence, the horizontal sliding rail 234 of the sliding flat panel display and keyboard module according to the present invention can effectively support the keyboard 220 for stably operating the keyboard 220 thereon. The width of the horizontal sliding rail 234 can be larger than the thickness of the keyboard 220 to further increase the supporting strength of the keyboard 220 so as to not influence the total thickness of the keyboard 220. Therefore, the horizontal sliding rail 234 can further decrease the thickness of the keyboard 220, thereby improving the space utilization in the 1U server racks.

The vertical sliding rail 232 of the flat panel display 210 further utilizes a short internal slide to increase a predetermined sliding stroke for the flat panel display 210. In conjunction with a flat panel display supporting bracket 219 of the flat panel display 210, the predetermined stroke can allow the open angle (referring to FIG. 1D) of the flat panel display 210 to be greater than 90 degrees, thereby conveniently controlling the server computers on the server racks for the users. In particular, the flat panel display 210 can avoid an open angle less than 90 degrees, even when a protruding handle is disposed above the flat panel display 210. The open angle less than 90 degrees induces the flat panel display 210 to face a little bit downward so as to disturb the control on the server computers by the users.

On the front portion of the keyboard 220, a handle 228 is fixed thereon for conveniently drawing out the keyboard 220. In addition, a linking plate 229 is disposed on the rear portion of the keyboard 220 to enable the flat panel display 210 linking with the keyboard 220. That is to say, the flat panel display 210 is drawn out simultaneously with the keyboard 220 when the user draws out the keyboard 220. Generally speaking, the keyboard 220 has to operate together with the flat panel display 210 for controlling and monitoring the server computers. Accordingly, the linking plate 229 enabling the flat panel display 210 to link with the keyboard 220 makes controlling and monitoring the server computers convenient. The keyboard 220 further includes rollers 211 configured on the surface thereof to keep a distance with the flat panel display 210 so that the flat panel display 210 can be smoothly drawn out from the sliding module 230. The rollers 211 can be configured on the surface of the flat panel display 210, the surface of the keyboard 220, or both the surfaces of the flat panel display 210 and the keyboard 220.

Figure 4:
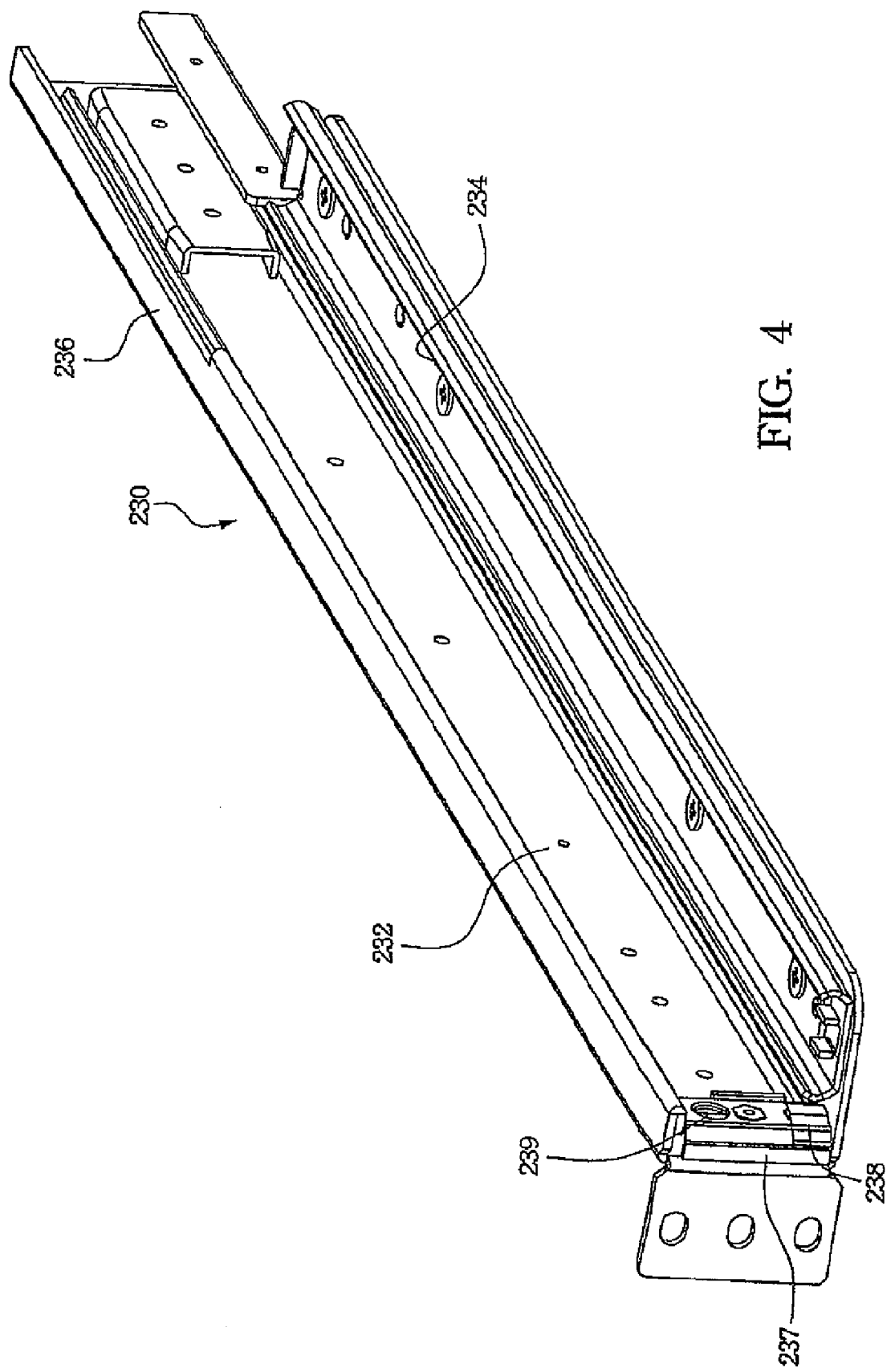
FIG. 4 is a partially enlarged view of the sliding module of FIG. 2.

The flat panel display 210 further includes a handle 218 disposed on the front portion thereof, allowing a user to draw out conveniently the flat panel display 210. Referring to FIG. 2 and FIG. 4, both sides of the handle 218 include positioning switches 212. The positioning switch 212 utilizes positioning pins 214 disposed on both sides of the flat panel display 210 to couple to positioning holes 239 of the positioning bracket 237 on the sliding module 230, thereby effectively fixing the flat panel display 210 in the sliding module 230 to avoid an unexpected withdrawal or motion when the flat panel display 210 is stored in the sliding module 230.

The flat panel display supporting bracket 219 configured on the rear portion of the flat panel display 210 further includes a positioning switch 216, such as, for example, a movable positioning pin, to couple to the positioning hole 239 of the positioning bracket 237 when the flat panel display 210 is drawn out from the sliding module 230. Accordingly, the flat panel display 210 can withstand a force acting thereon when the flat panel display 210 is rotated to open or close. The flat panel display 210 can be easily retrieved into the sliding module 230 by withdrawing the positioning switch 216 from the positioning hole 239. When the flat panel display 210 is drawn out again, a spring piece 238 of the positioning bracket 237 pushes the positioning switch 216 to protrude again. The positioning switch 216 thus couples to the positioning hole 239 of the positioning bracket 237, again, so as to fix the flat panel display 210 in a predetermined operating position. Furthermore, the predetermined operating position can provide the open angle greater than 90 degrees, allowing convenient monitoring of the flat panel display 210.

In addition, in combining the positioning switch 212 with the linking plate 229, the keyboard 220 is simultaneously locked in the sliding module 230 when the flat panel display 210 is locked in the sliding module 230. Unexpected withdrawal or motion to cause equipment damage is thereby avoided.

Figure 3:
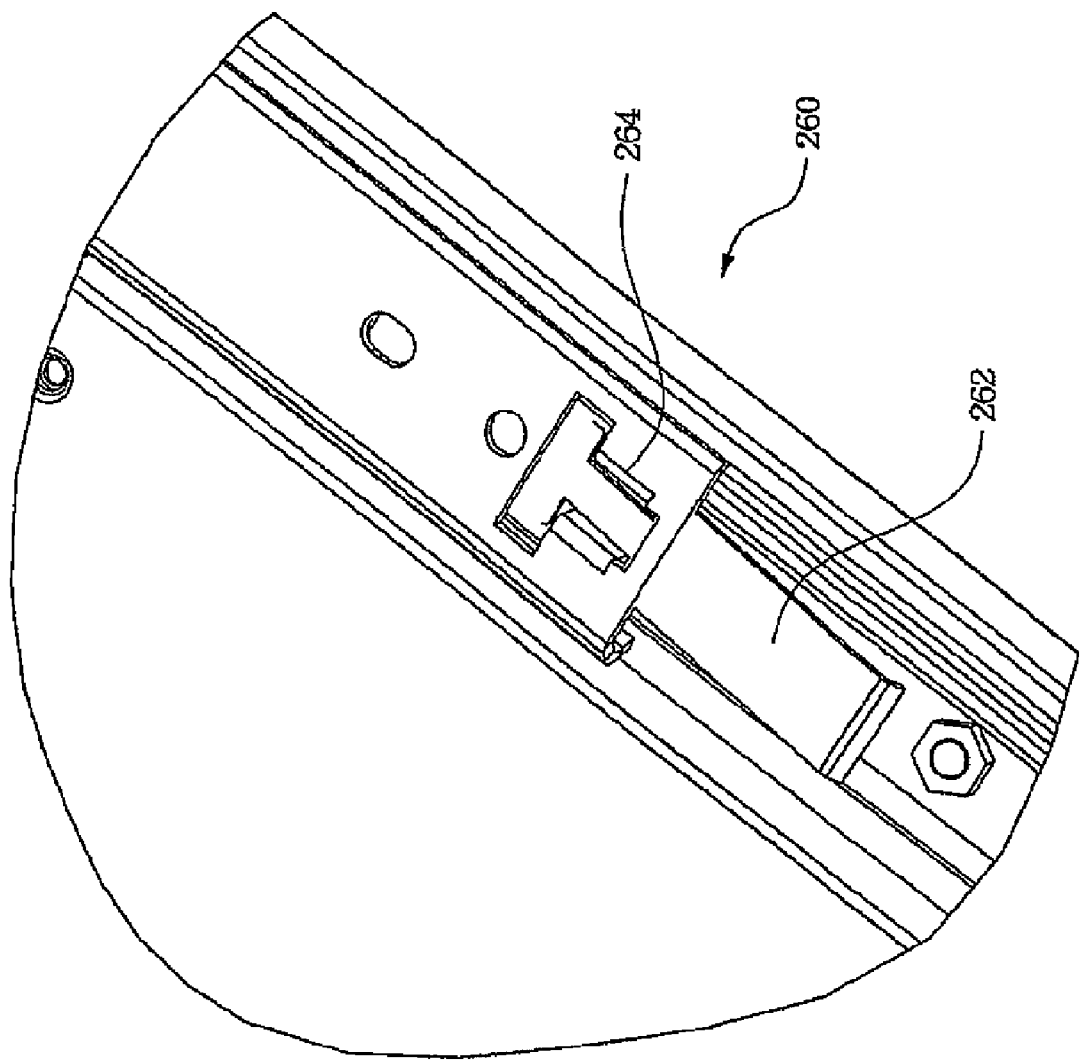
FIG. 3 is a preferred embodiment of the positioning mechanism of the keyboard module.

Referring to FIGS. 2 and 3, the keyboard 220 further includes a positioning mechanism 260 composed of a spring piece 262 and a positioning slot 264. The spring piece 262 is disposed at a bottom side and a rear portion of the keyboard 220, e.g. under the slide, and positioning slot 264 is formed on one end portion, near the user, of the horizontal sliding rail 234. When the keyboard 220 is drawn out, the spring piece 262 couples to the positioning slot 264 to fix the keyboard 220 in a suitable operation position. Retrieval of the keyboard 220 due to an unexpected vibration or force is thereby avoided.

When the user wants to retrieve the keyboard 220, the spring piece 262 under the keyboard 220 is first pressed upward to release the spring piece 262 from the positioning slot 264. The keyboard 220 can then slide in the sliding module 230.

Furthermore, a control module 240 is configured behind the flat panel display 210 and the keyboard 220 to transmit power and signals. The control module 240 further includes a cable supporting link 242, a power supply 244, and a connector 246. The cable supporting link 242 is able to stretch or shrink to continue transmitting the power and signal to the flat panel display 210 and the keyboard 220 when the flat panel display 210 and the keyboard 220 are drawn out or retrieved. The power supply 244 provides a required power for the flat panel display 210 and the keyboard 220, and the connector 246 is coupled to a computer apparatus, such as, for example, a server computer or a KVM (keyboard-video-mouse) switch, on the server rack.

Another aspect of the present invention is to provide a KVM switch module including the foregoing sliding flat panel display and keyboard module, thereby conveniently used on a 1U server rack. After the connector 252 of the KVM switch module 250 is coupled to the connector 246 of the control module 240, the flat panel display 210 and the keyboard 220 are utilized to control and monitor the server computers coupled with the KVM switch module 250.

Accordingly, the sliding flat panel display and keyboard module according to the present invention are suitable for configuration in the 1U server rack, and further provide a safe and reliable environment for controlling the server computers. The sliding flat panel display and keyboard module according to the present invention adopt separated sliding rails perpendicular to each other to support the flat panel display and the keyboard, respectively, thereby enhancing the supporting strength of the flat panel display and keyboard. In addition, because the thickness of the sliding rail of the keyboard can be less than a height of a conventional keyboard, the width of the sliding rail of the flat panel display can be designed greater than the thickness of the flat panel display, thereby further increasing the supporting strength of the flat panel display. In combination with the safe positioning device, the sliding flat panel display and keyboard module can be operated more safely and stably whenever the sliding flat panel display and keyboard module is retrieved or drawn out.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A sliding flat panel display and keyboard module, comprising:
   a supporting frame having a vertical plane and a horizontal plane, wherein the vertical plane and the horizontal plane are elongated along a first direction, wherein the vertical plane extends in a second direction perpendicular to the first direction, wherein the horizontal plane extends in a third direction perpendicular to the first direction, and wherein the second direction and the third direction are non-parallel with respect to each other;
   a vertical slider, configured on the vertical plane of the supporting frame, wherein the vertical slider is elongated in the first direction and has a cross-section which extends in the second direction;
   a horizontal slider, configured on the horizontal plane of the supporting frame, wherein the horizontal slider is elongated in the first direction and has a cross-section which extends in the third direction;
   a flat panel display, coupling to the vertical slider to move in the first direction along the supporting frame; and a keyboard, coupling to the horizontal slider to move in the first direction along the supporting frame, wherein the flat panel display and the keyboard are selectively de-linked to move independently along their respective sliders and linked to move together along their respective sliders when the flat panel display and the keyboard move in the first direction.

2. The sliding flat panel display and keyboard module of claim 1, wherein the supporting frame is coupled to a server rack.

3. The sliding flat panel display and keyboard module of claim 1, wherein the horizontal slider further comprises a positioning mechanism disposed at a rear portion of the keyboard to lock the keyboard in a predetermined position when the keyboard is drawn out along the horizontal slider.

4. The sliding flat panel display and keyboard module of claim 3, wherein the positioning mechanism comprises a spring piece and a positioning slot, and the spring piece is coupled to the positioning slot when the keyboard reaches the predetermined position.

5. The sliding flat panel display and keyboard module of claim 1, wherein the keyboard further comprises a linking plate to link the keyboard with the flat panel display, and the flat panel display and the keyboard respectively move together along the vertical slider and the horizontal slider via the linking plate.

6. The sliding flat panel display and keyboard module of claim 1, wherein the flat panel display further comprises a positioning switch controlling a positioning pin, and the positioning pin inserts into a positioning hole on the vertical slider when the flat panel display is retrieved.

7. The sliding flat panel display and keyboard module of claim 1, wherein the keyboard further comprises a roller disposed on a surface of the keyboard to support the flat panel display.

8. The sliding flat panel display and keyboard module of claim 1, further comprising a positioning switch and a positioning hole, the positioning hole is disposed at a front portion of the vertical slider and the positioning switch on the flat panel display is coupled to the positioning hole when the flat panel display is drawn out.

9. The sliding flat panel display and keyboard module of claim 1, wherein an open angle between the flat panel display and the keyboard is greater than 90 degrees when the flat panel display is drawn out and opened upwardly.

10. The sliding flat panel display and keyboard module of claim 9, wherein the open angle is about 95-97 degrees.

11. The sliding flat panel display and keyboard module of claim 1, wherein a width of the horizontal slider is greater than a thickness of the keyboard, and wherein a height of the vertical slider is greater than a thickness of the flat panel display.

12. The sliding flat panel display and keyboard module of claim 1, wherein the second direction and the third direction are perpendicular to each other.

13. A server rack-mounted KVM switch for configuring on a server rack, the server rack-mounted KVM switch comprising:

a first slider elongated along a first direction, wherein its cross-section in a plane perpendicular to the first direction extends in a second direction;

a second slider elongated along the first direction, wherein its cross-section in a plane perpendicular to the first direction extends in a third direction, wherein the second direction and the third direction are non-parallel with respect to each other;

a flat panel display, sliding in the first direction along the first slider on the server rack and rotating relative to the first-slider;

a keyboard, sliding in the first direction along the second slider on the server rack; and a KVM switch module, disposed behind the flat panel display and the keyboard, wherein the flat panel display and the keyboard are selectively de-linked to move independently along their respective sliders and linked to move together along their respective sliders when the flat panel display and the keyboard move in the first direction.

14. The server rack-mounted KVM switch of claim 13, further comprising a supporting frame, wherein the supporting frame and the first slider couple the flat panel display to the server rack, and the supporting frame and the second slider couple the keyboard to the server rack.

15. The server rack-mounted KVM switch of claim 13, wherein the server rack is a 1U server rack.

16. The server rack-mounted KVM switch of claim 13, wherein an open angle between the flat panel display and the keyboard is greater than 90 degrees when the flat panel display is drawn out and opened upwardly.

17. The server rack-mounted KVM switch of claim 16, wherein the open angle is about 95-97 degrees.

18. The server rack-mounted KVM switch of claim 13, wherein a width of the second slider is greater than a thickness of the keyboard, and wherein a height of the first slider is greater than a thickness of the flat panel display.

19. The server rack-mounted KVM switch of claim 13, further comprising a control module disposed behind the flat panel display and the keyboard and electrically connected to at least one of the flat panel display and the keyboard.

20. The server rack-mounted KVM switch of claim 13, wherein the keyboard further comprises a linking plate to link the keyboard with the flat panel display while the keyboard is drawn out of the server rack.

* * * * *